(12) United States Patent
Losiewicz et al.

(10) Patent No.: US 11,987,065 B1
(45) Date of Patent: *May 21, 2024

(54) DUAL FUNCTION TOOLING TRAY HAVING MOVABLE CENTER SECTION FOR STENCIL PRINTER

(71) Applicant: Illinois Tool Works Inc., Glenview, IL (US)

(72) Inventors: William A. Losiewicz, Douglas, MA (US); James Lynch, Uxbridge, MA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/142,659

(22) Filed: May 3, 2023

(51) Int. Cl.
*B41F 15/34* (2006.01)
*B41F 15/42* (2006.01)
*B41L 13/18* (2006.01)

(52) U.S. Cl.
CPC .............. *B41L 13/18* (2013.01); *B41F 15/34* (2013.01); *B41F 15/42* (2013.01)

(58) Field of Classification Search
CPC .......... B41F 15/34; B41F 15/42; B41L 15/18
See application file for complete search history.

(56) References Cited

U.S. PATENT DOCUMENTS

2020/0391314 A1 * 12/2020 Losiewicz ............... B41F 15/14
2020/0391530 A1 * 12/2020 Losiewicz ............. B41N 1/248
2020/0391531 A1 * 12/2020 Losiewicz ............... B41F 15/44

FOREIGN PATENT DOCUMENTS

CN         217283631 U  *  8/2022
WO   WO-2018105016 A1 *  6/2018   .......... B41F 15/0881

* cited by examiner

*Primary Examiner* — Christopher E Mahoney
*Assistant Examiner* — Marissa Ferguson-Samreth
(74) *Attorney, Agent, or Firm* — Lando & Anastasi, LLP

(57) ABSTRACT

A dual function tooling tray having a movable center section includes a perimeter frame having four sides, a first frame member spaced from a first side of the perimeter frame, and a second frame member spaced from a second side of the perimeter frame. The first side and the second side of the perimeter frame are parallel with one another. The tooling tray further includes a third frame member extending between and secured to the first frame member and the second frame member. The third frame member is configured to support at least one squeegee blade. The third frame member is configured be to be moved from a first position from the first frame member and the second frame member and installed in a second position on the first frame member and the second frame member, with the second position being spaced from the first position.

19 Claims, 11 Drawing Sheets

DUAL FUNCTION TOOLING TRAY HAVING MOVABLE CENTER SECTION FOR STENCIL PRINTER

BACKGROUND OF THE DISCLOSURE

1. Field of Invention

This application relates generally to stencil printers and related methods to print viscous materials, e.g., solder paste, on an electronic substrate, e.g., a printed circuit board (PCB), and more particularly to systems and methods for replacing items in a stencil printer including a dual function tooling tray configured to move items into the stencil printer.

2. Discussion of Related Art

In manufacturing a surface-mount printed circuit board, a stencil printer can be used to print solder paste onto the circuit board. Typically, a circuit board having a pattern of pads or some other conductive surface onto which solder paste will be deposited is automatically fed into the stencil printer; and one or more small holes or marks (known as "fiducials") on the circuit board are used to properly align the circuit board with the stencil or screen of the stencil printer prior to printing solder paste onto the circuit board. In some systems, an optical alignment system embodying an imaging or vision system is used to align the circuit board with the stencil.

Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the circuit board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste typically is dispensed onto the stencil from a standard cartridge. The stencil is then separated from the circuit board and the adhesion between the circuit board and the solder paste causes most of the material to stay on the circuit board. Material left on the surface of the stencil is removed in a cleaning process before additional circuit boards are printed.

Another process in the printing of circuit boards involves inspection of the circuit boards after solder paste has been deposited on the surface of the circuit boards. Inspecting the circuit boards is important for determining that clean electrical connections can be made. An excess of solder paste can lead to shorts, while too little solder paste in appropriate positions can prevent electrical contact. Generally, the imaging inspection system is further employed to provide a two-dimensional or a three-dimensional inspection of the solder paste on the circuit board.

Present day stencil printers require manual intervention to perform routine operations. For example, during a changeover, an operator must perform many manual tasks, such as changing a stencil, replacing a solder paste cartridge, replacing squeegee blades, and replacing support tooling. Each of these tasks require the operator to manually perform the task. For example, with most stencil printers, the operator must unlock the stencil, remove the stencil, properly insert a replacement stencil, and lock the replacement stencil in place. A changeover operation can take as long as 30 minutes, during which the stencil printer is not operating, which may result in the PCB fabrication line not operating.

SUMMARY OF THE DISCLOSURE

One aspect of the present disclosure is directed to a dual function tooling tray having a movable center section for a stencil printer. In one embodiment, the tooling tray comprises a perimeter frame having four sides, a first frame member spaced from a first side of the perimeter frame, and a second frame member spaced from a second side of the perimeter frame. The first side and the second side of the perimeter frame are parallel with one another. The tooling tray further comprises a third frame member extending between and secured to the first frame member and the second frame member. The third frame member is configured to support at least one squeegee blade. The third frame member is configured be to be moved from a first position from the first frame member and the second frame member and installed in a second position on the first frame member and the second frame member, with the second position being spaced from the first position.

Embodiments of the tooling tray further may include locating the first position of the third frame member along midpoints of the first frame member and the second frame member. The second position of the third frame member may be spaced from the first position toward one of a third side and a fourth side of the perimeter frame. The third frame member may include opposite ends, each end having a connector configured to mate its respective first frame member and second frame member. Each connector may include at least one downwardly extending prong configured to be received in an opening of its respective first frame member or second frame member to position the third frame member with respect to the first frame member and the second frame member. Each connector may include a spring-loaded detent assembly configured to releasably secure the connector to its respective first frame member or second frame member. The third frame member may include at least one squeegee blade support structure. The third frame member further may include a drip tray secured to a bottom surface of the third frame member. The tooling tray further may include a first support secured to the first frame member and a second support secured to the second frame member. The first support and the second support together are configured to support a tooling plate. The tooling tray further may include a third support secured to the first frame member and a fourth support secured to the second frame member. The third support and the fourth support together are configured to support a tooling plate. The first support and the second support may be positioned adjacent a third side of the perimeter frame and the third support and the fourth support may be positioned adjacent a fourth side of the perimeter frame. The first support and the second support may be spaced apart from one another a predetermined distance sufficient to support the tooling plate. The third support and the fourth support may be spaced apart from one another a predetermined distance sufficient to support the tooling plate. The first support, the second support, the third support, and the fourth support each may include a feature configured to engage a mating feature associated with the tooling plate to support the tooling plate. The feature may be a pin and the mating feature may be an opening sized to receive the pin.

Another aspect of the present disclosure is directed to a method for replacing items in a stencil printer. In one embodiment, the method comprises: providing a tooling tray including a perimeter frame having four sides, a first frame member spaced from a first side of the perimeter frame, a second frame member spaced from a second side of the perimeter frame, the first side and the second side of the perimeter frame being parallel with one another, and a third frame member extending between and secured to the first frame member and the second frame member, the third frame member being configured to support at least one squeegee blade, the third frame member being configured to move from a first position in which the third frame member is located at midpoints of the first frame member and the second frame member to a second position spaced from the first position, the second position being spaced from the first position, the tooling tray further including a first tooling support, a second tooling support and a squeegee blade support; providing a new tooling plate on the first tooling support of the tooling tray; removing a used tooling plate from a support assembly of a stencil printer; positioning the used tooling plate on the second tooling support of the tooling tray; moving the third frame member from the first position to the second position; removing the new tooling plate from the tooling tray; and installing the new tooling plate on the support assembly of the stencil printer.

Embodiments of the method further may include moving the third frame member from the second position to the first position once the new tooling plate is installed on the support assembly of the stencil printer. The third frame member may include opposite ends, each end having a connector configured to mate its respective first frame member and second frame member. Each connector may include at least one downwardly extending prong configured to be received in an opening of its respective first frame member or second frame member. The method further may include positioning the third frame member with respect to the first frame member and the second frame member. Each connector may include a spring-loaded detent assembly configured to releasably secure the connector to its respective first frame member or second frame member. The method further may include releasably securing the third frame member to the first frame member and the second frame member. The movements of the third frame member between the first position and the second position may be achieved by tooling members of a print head assembly of a stencil printer. The tooling members each may include a pin having a head configured to releasably engage the connectors of the third frame member.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

Figure 1:
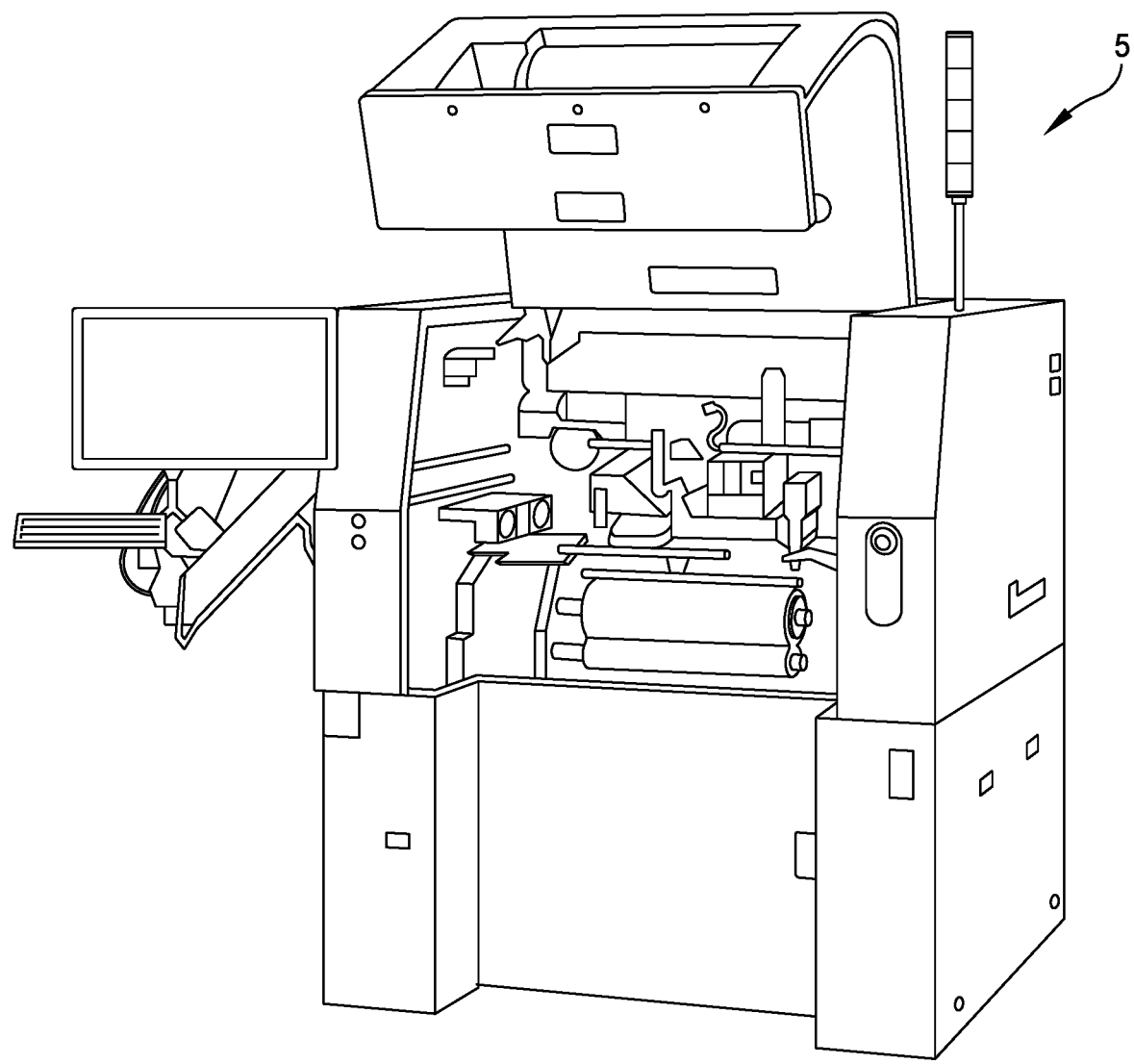
FIG. 1 is a front perspective view of a stencil printer.

The present disclosure relates generally to material application machines (referred to herein as "stencil printers," "screen printers," "printing machines," or "printers") and other equipment utilized in a surface mount technology (SMT) process lines and configured to apply an assembly material (e.g., solder paste, conductive ink, or encapsulation material) onto a substrate (e.g., a printed circuit board, referred to herein as an "electronic substrate," a "circuit board," a "board," a "PCB," a "PCB substrate," a "substrate," or a "PCB board") or to perform other operations, such as inspection, rework, or placement of electronic components onto a substrate. Specifically, embodiments of the present disclosure are described below with reference to stencil printers used to produce printed circuit boards.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

For purposes of illustration, embodiments of the present disclosure will now be described with reference to a stencil printer used to print an assembly material, such as solder paste, onto a circuit board. One skilled in the art will appreciate, however, that embodiments of the present disclosure are not limited to stencil printers that print solder paste onto circuit boards, but rather, may be used in other applications requiring dispensing of other viscous assembly materials, such as glues and encapsulents. For example, the apparatus may be used to print epoxy for use as underfill for chip-scale packages. Further, stencil printers in accordance with embodiments of the present disclosure are not limited to those that print assembly materials on circuit boards, but rather, include those used for printing other materials on a variety of substrates, such as semiconductor wafers. Also, the terms screen and stencil may be used interchangeably herein to describe a device in a printer that defines a pattern to be printed onto a substrate. In certain embodiments, the stencil printer may include a Momentum® or an Edison™ series stencil printer platform offered by ITW Electronic Assembly Equipment of Hopkinton, Massachusetts. An exemplary stencil printer is generally designated at 5 in FIG. 1. In this embodiment, the stencil printer 5 is an Edison® series stencil printer platform offered by ITW Electronic Assembly Equipment of Hopkinton, Massachusetts.

Figure 2:
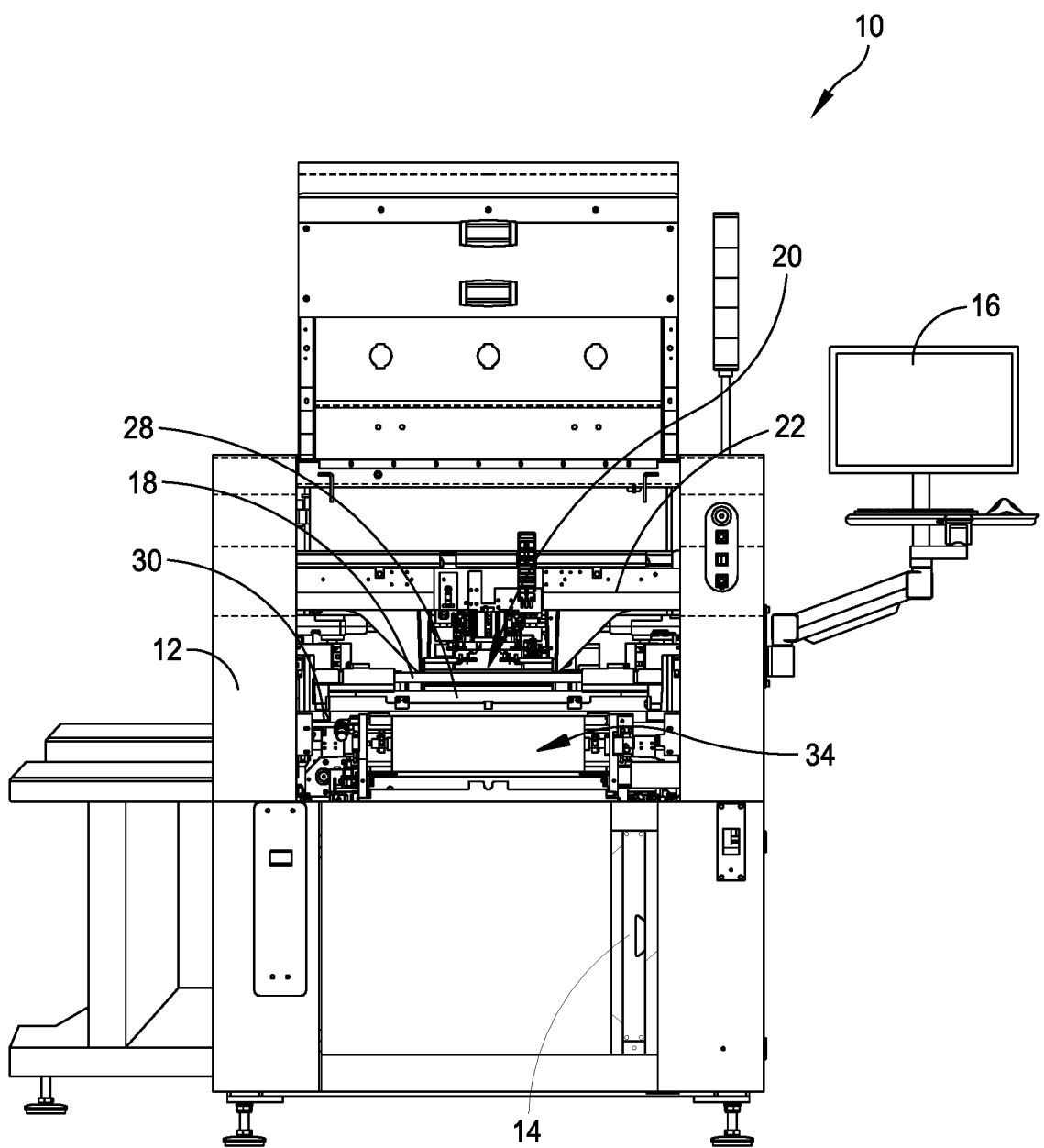
FIG. 2 is a front view of a stencil printer.

Referring to FIG. 2, there is generally indicated at 10 a stencil printer of an embodiment of the disclosure. As shown, the stencil printer 10 includes a frame 12 that supports components of the stencil printer. The components of the stencil printer may include, in part, a controller 14, a display 16, a stencil 18, and a print head or print head assembly, generally indicated at 20, which is configured to apply the solder paste in a manner described in greater detail below.

As shown in FIG. 2 and described below, the stencil and the print head assembly may be suitably coupled or otherwise connected to the frame 12. In one embodiment, the print head assembly 20 may be mounted on a print head assembly gantry 22, which may be mounted on the frame 12. The print head assembly gantry 22 enables the print head assembly 20 to be moved in the y-axis direction under the control of the controller 14 and to apply pressure on the print head assembly as it engages the stencil 18. In a certain embodiment, the print head assembly 20 may be placed over the stencil 18 and may be lowered in the z-axis direction into contact with the stencil to make a seal with the stencil.

The stencil printer 10 may also include a conveyor system having rails (not shown) for transporting a printed circuit board (sometimes referred to as a "printed wiring board," "substrate," or "electronic substrate" herein) to a print position in the stencil printer. The rails sometimes may be referred to herein as a "tractor feed mechanism," which is configured to feed, load or otherwise deliver circuit boards to the working area of the stencil printer, which may be referred to herein as a "print nest," and to unload circuit boards from the print nest.

Figure 3:
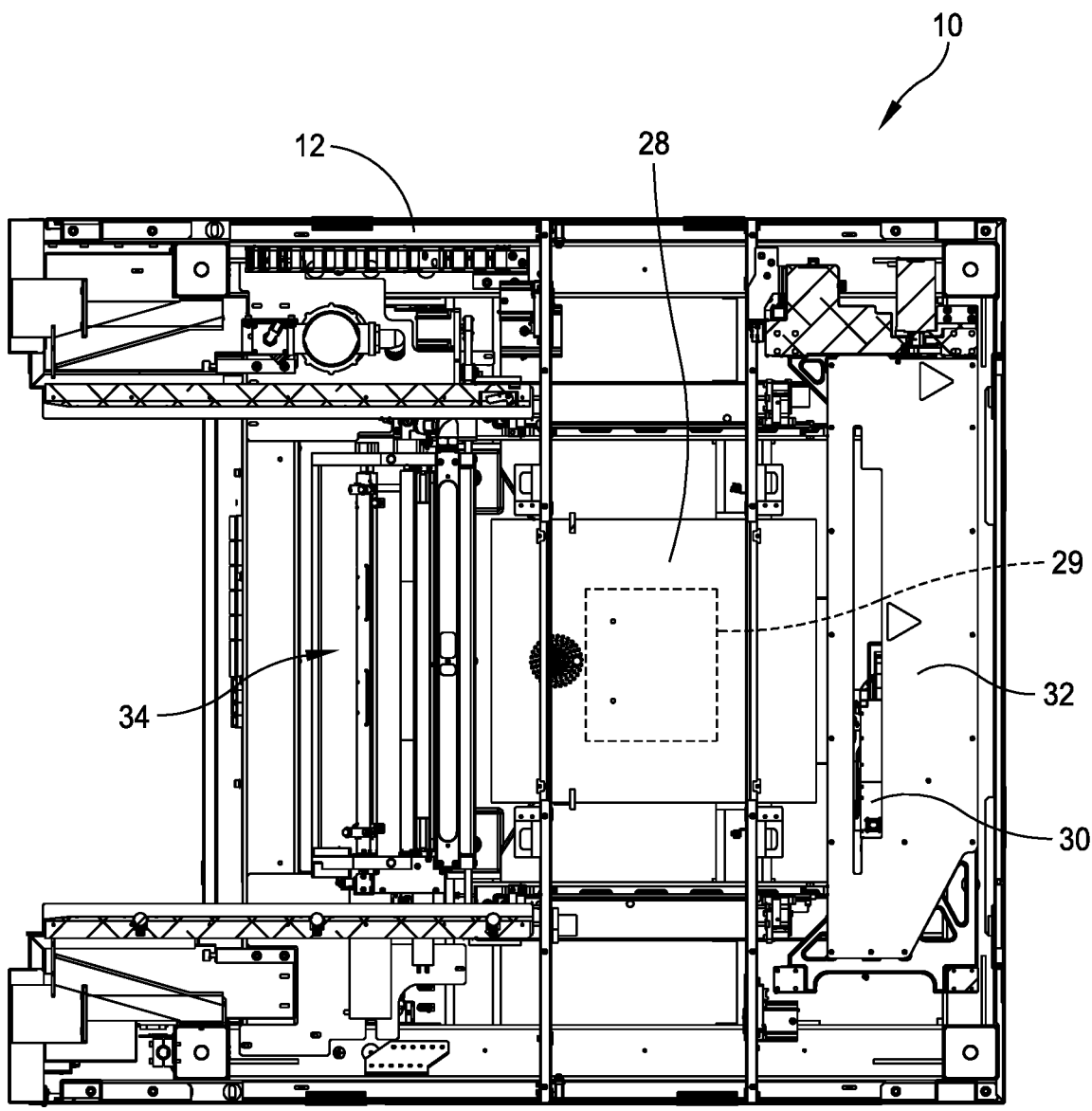
FIG. 3 is a top plan view of the stencil printer illustrated in FIG. 2 with portions removed.

Referring additionally to FIG. 3, the stencil printer 10 has a support assembly 28 to support the circuit board 29 (shown in dashed lines), which raises and secures the circuit board so that it is stable during a print operation. In certain embodiments, the substrate support assembly 28 further may include a particular substrate support system, e.g., a solid support, a plurality of pins or flexible tooling, which is positioned beneath the circuit board when the circuit board is in the print position. The substrate support system may be used, in part, to support the interior regions of the circuit board to prevent flexing or warping of the circuit board during the print operation.

In one embodiment, the print head assembly 20 may be configured to receive solder paste from a source, such as a dispenser, e.g., a solder paste cartridge, which provides solder paste to the print head assembly during the print operation. Other methods of supplying solder paste may be employed in place of the cartridge. For example, solder paste may be manually deposited between the blades or from an external source. Additionally, in a certain embodiment, the controller 14 may be configured to use a personal computer having a suitable operating system, such as a Microsoft Windows® operating system provided by Microsoft Corporation, with application specific software to control the operation of the stencil printer 10. The controller 14 may be networked with a master controller that is used to control a production line for fabricating circuit boards.

In one configuration, the stencil printer 10 operates as follows. A circuit board 29 is loaded into the stencil printer 10 using the conveyor rails. The support assembly 28 raises and secures the circuit board 29 to a print position. The print head assembly 20 is then lowered in the z-axis direction until blades of the print head assembly contact the stencil 18 at a desired pressure. The print head assembly 20 is then moved in the y-axis direction across the stencil 18 by the print head assembly gantry 22. The print head assembly 20 deposits solder paste through apertures in the stencil 18 and onto the circuit board 29. Once the print head assembly has fully traversed the stencil 18 across the apertures, the print head assembly is lifted off the stencil and the circuit board 29 is lowered back onto the conveyor rails. The circuit board 29 is released and transported from the stencil printer 10 so that a second circuit board may be loaded into the stencil printer. To print on the second circuit board 29, the print head assembly is lowered in the z-axis direction into contact with the stencil and moved across the stencil 18 in the direction opposite to that used for the first circuit board.

An imaging system 30 may be provided for the purposes of aligning the stencil 18 with the circuit board 29 prior to printing and to inspect the circuit board after printing. In one embodiment, the imaging system 30 may be disposed between the stencil 18 and the support assembly 28 upon which a circuit board is supported. The imaging system 30 is coupled to an imaging gantry 32 to move the imaging system. In one embodiment, the imaging gantry 32 may be coupled to the frame 12, and includes a beam that extends between side rails of the frame 12 to provide back and forth movement of the imaging system 30 over the circuit board 29 in a y-axis direction. The imaging gantry 32 further may include a carriage device, which houses the imaging system 30, and is configured to move along the length of the beam in an x-axis direction. The construction of the imaging gantry 32 used to move the imaging system 30 is well known in the art of solder paste printing. The arrangement is such that the imaging system 30 may be located at any position below the stencil 18 and above the circuit board 29 to capture an image of predefined areas of the circuit board or the stencil, respectively.

After one or more applications of the solder paste to circuit boards, excess solder paste may accumulate at the bottom of the stencil 18 and a stencil wiper assembly, generally indicated at 34, and may move beneath the stencil to remove the excess solder paste. In other embodiments, the stencil 18 may be moved over the stencil wiper assembly.

As mentioned above, stencil printers have traditionally required manual intervention to perform replacement of certain parts and/or replenishment operations. For example, a typical stencil requires replacement after a certain period of time, e.g., four hours. Also, stencils need replacement for separate production runs. In addition, solder paste cartridges, which supply temperature-controlled solder paste to the stencil printer, require replacement over time, e.g., within four hours or less. A separate production run may require a different type of solder paste material. Another item requiring periodic replacement is squeegee blades, which are subject to wearing during use. And finally, tooling used to support a substrate in a print position is subject to replacement when changing from one production product to another.

In one embodiment, a method of replacing a stencil and/or items placed on tooling trays may include, when a request for a new stencil and/or item on a tooling tray is made, either for a new production run or because of wear on an existing stencil and/or item, a clean stencil and/or item is provided on a movable cart. At the production line, the "dirty" or used stencil and/or item is removed from the stencil printer and the "clean" or new stencil and/or item is inserted into the stencil printer from the movable cart and secured for use. The dirty stencil and/or item is transported to a cleaning station where the stencil and/or item is cleaned and ready for reuse. Once cleaned, the stencil and/or item may be transported back to the stencil printer or a stockroom, where the stencil and/or can be reused during the same or different production run.

Figure 4:
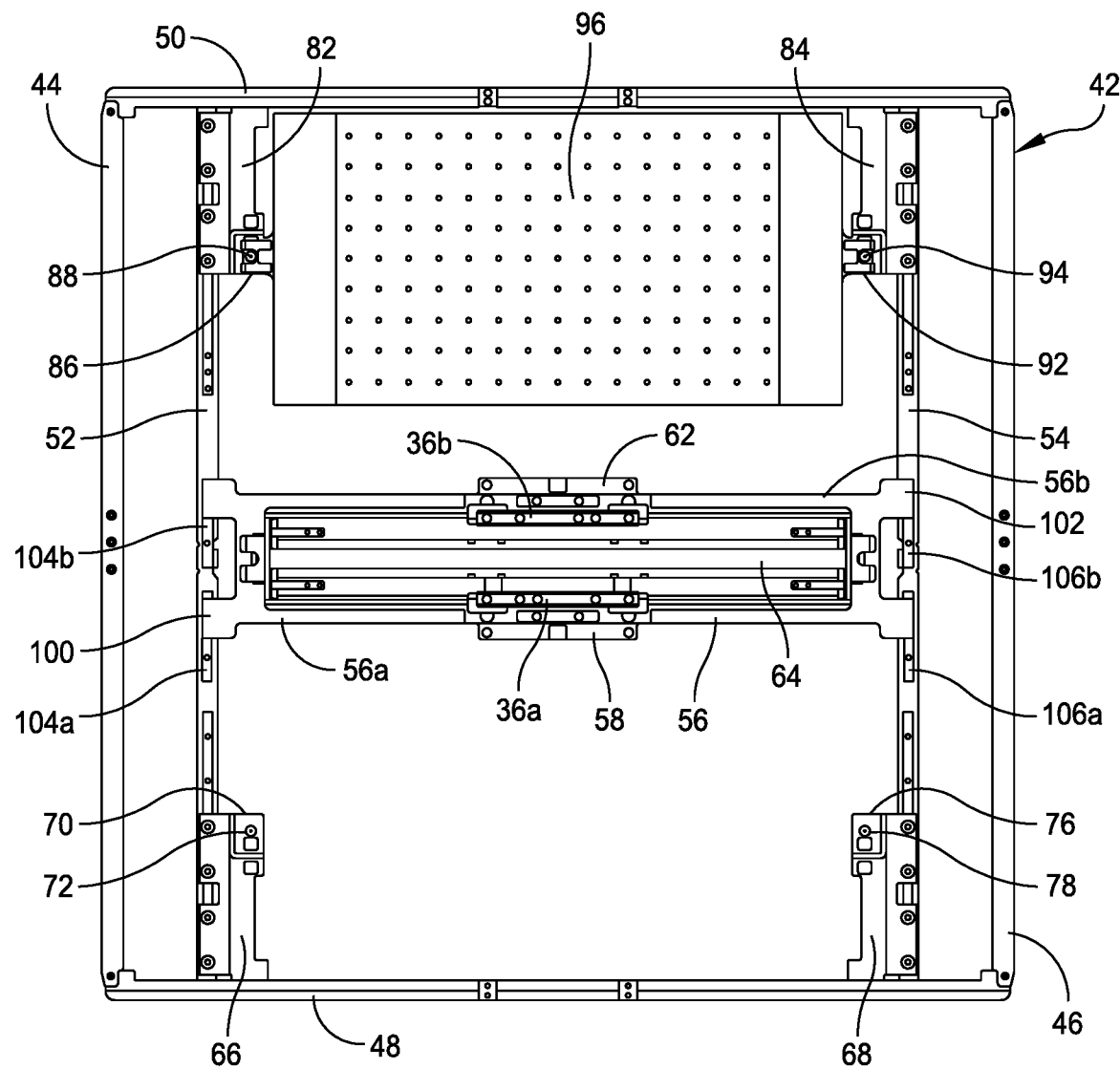
FIG. 4 is a top plan view of a dual function tooling tray having a movable center section of an embodiment of the present disclosure, the tooling tray supporting clean tooling.

To accommodate the transfer of new and used squeegee blades and tooling within the stencil printer, a specially designed tooling tray may be provided. Referring to FIG. 4, in one embodiment, a tooling tray is generally indicated at 40. As shown, the tooling tray 40 includes a square-shaped perimeter frame generally indicated at 42 having four sides, a first side 44, a second side 46 that is parallel to the first side, a third side 48 connected to ends of the first side and the second side, and a fourth side 50 connected to opposite ends of the first side and the second side. In one embodiment, the tooling tray 40 is sized and shaped the same as the stencil 18 of the stencil printer 10. The tooling tray 40 further includes a first frame member 52 spaced from the first side 44 of the perimeter frame 42 and extending between the third side 48 and the fourth side 50 of the perimeter frame and a second frame member 54 spaced from the second side 46 of the perimeter frame and extending between the third side 48 and the fourth side 50 of the perimeter frame. As shown, the first side 44 of the perimeter frame 42, the first frame member 52, the second frame member 54, and the second side 46 of the perimeter frame are parallel with one another.

The tooling tray 40 further includes a third frame member 56 that extends between and is secured to the first frame member 52 and the second frame member 54. In one embodiment, the third frame member 56 includes two spaced apart rails 56a, 56b, each rail being configured to support individual squeegee blades. Specifically, a first rail 56a of the third frame member 56 includes a first squeegee blade support structure 58 that is configured to support a squeegee blade 36a. A second rail 56b of the third frame member 56, which is spaced from the first rail 56a, includes a squeegee blade support structure 62 that is configured to support a squeegee blade 36b. As shown, the tooling tray 40 is supporting one or more used squeegee blades, e.g., two squeegee blades 36a, 36b.

As shown, the third frame member 56 is perpendicular to the first frame member 52 and the second frame member 54. Further, the third frame member 56 may include a drip tray 64 to collect solder paste that may drip from the used squeegee blades. In one embodiment, the drip tray 64 can extend between the first rail 56a and the second rail 56b of the third frame member 56. It is known that used squeegee blades may include excess solder paste disposed on them and if the excess solder paste drips from the squeegee blades it may drip on the working or operating components of the stencil printer 10 or on printed circuit boards, e.g., circuit board 29, supported by the stencil printer. This is undesirable. In one embodiment, the drip tray 64 can be secured to a bottom surface of the third frame member 56 beneath the squeegee blade support structures 58, 62.

The tooling tray 40 further includes a first support 66 secured to the first frame member 52 and a second support 68 secured to the second frame member 54 adjacent a third side 48 of the perimeter frame 42. Together, the first support 66 and the second support 68 are configured to support tooling. Specifically, the first support 66 and the second support 68 both extend inwardly with respect to their respective frame member 52, 54. In the shown embodiment, the first support 66 and the second support 68 are positioned adjacent the third side 48 of the perimeter frame 42. Depending on the size of the tooling, the first support 66 and the second support 68 are spaced apart from one another a predetermined distance sufficient to support the tooling. In the shown embodiment, the first support 66 and the second support 68 are configured to support used tooling.

The first support 66 includes a support tab 70, which includes a feature that extends upwardly (along a z-axis) from the support tab. The feature is configured to engage a mating feature provided on one side of the tooling to support the tooling. In one embodiment, the feature embodies a pin 72 and the mating feature embodies an opening formed in a bottom surface of a support tab provided on one side of the tooling.

Similarly, the second support 68 includes a support tab 76, which includes a feature that extends upwardly (along a z-axis) from the support tab. The feature is configured to engage a mating feature provided on an opposite side of the tooling to support the tooling. In one embodiment, the feature embodies a pin 78 and the mating feature embodies an opening formed in a bottom surface of a support tab provided on the opposite side of the tooling. The arrangement is such that the support tabs 70, 76 of the first support 66 and the second support 68, respectively, hold the tooling in a precise position for transition from the tooling tray 40 to the stencil printer 10.

The tooling tray 40 further includes a third support 82 secured to the first frame member 52 and a fourth support 84 secured to the second frame member 54 adjacent a fourth side 50 of the perimeter frame 42. Together, the third support 82 and the fourth support 84 are configured to support tooling. Specifically, the third support 82 and the fourth support 84 both extend inwardly with respect to their respective frame member 52, 54. In the shown embodiment, the third support 82 and the fourth support 84 are positioned adjacent the fourth side 50 of the perimeter frame 42. Depending on the size of the tooling, the third support 82 and the fourth support 84 are spaced apart from one another a predetermined distance sufficient to support the tooling. In the shown embodiment, the third support 82 and the fourth support 84 are configured to support new or clean tooling.

The third support 82 and the fourth support 84 are constructed in a manner similar to the construction of the first support 66 and the second support 68, respectively. The third support 82 includes a support tab 86, which includes a feature that extends upwardly (along a z-axis) from the support tab. The feature is configured to engage a mating feature provided on one side of the tooling to support the tooling. In one embodiment, the feature embodies a pin 88 and the mating feature embodies an opening formed in a bottom surface of a support tab provided on one side of the tooling. Similarly, the fourth support 84 includes a support tab 92, which includes a feature that extends upwardly (along a z-axis) from the support tab. The feature is configured to engage a mating feature provided on an opposite side of the tooling to support the tooling. In one embodiment, the feature embodies a pin 94 and the mating feature embodies an opening formed in a bottom surface of a support tab provided on the opposite side of the tooling. The arrangement is such that the support tabs 86, 92 of the third support 82 and the fourth support 84, respectively, hold the tooling in a precise position for transition from the stencil printer 10 to the tooling tray 40. In the shown embodiment, the third support 82 and the fourth support 84 are supporting a new or clean tooling 96.

Figure 4A:
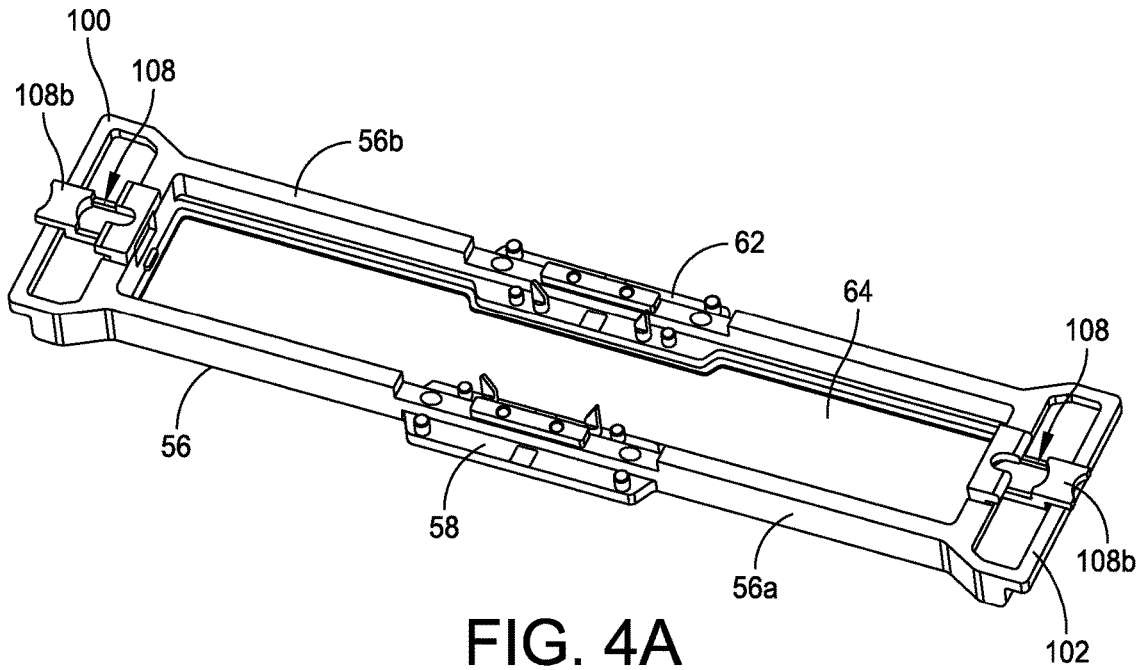
FIGS. 4A and 4B are top and bottom perspective views of a movable center section of the tooling tray.
Figure 4B:
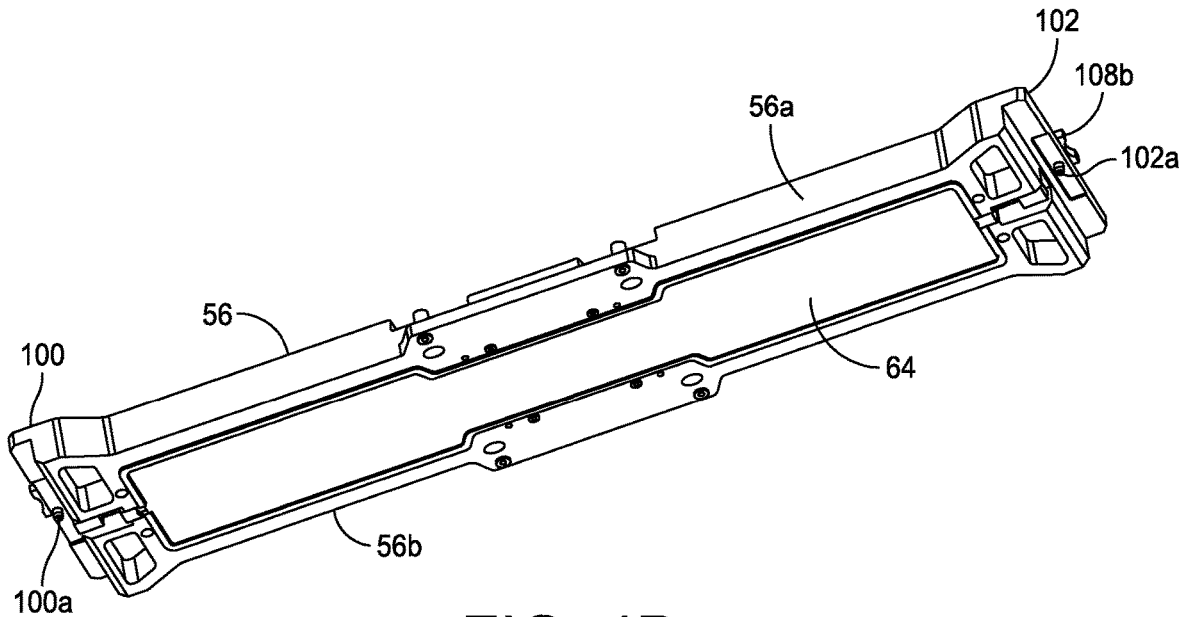
Figure 4C:
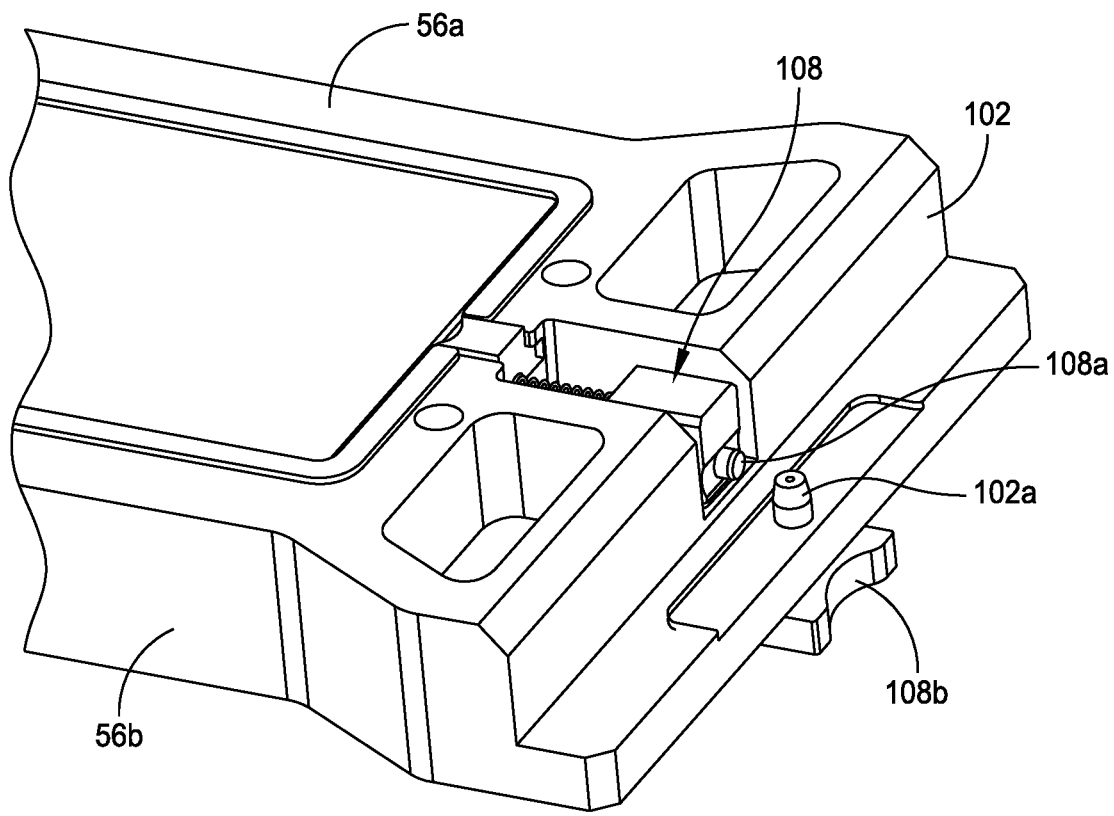
FIG. 4C is an exploded perspective view of a connector of the movable center section of the tooling tray.

With additional reference to FIGS. 4A, 4B and 4C, the third frame member 56, which is sometimes referred to as a center section of the tooling tray 40, is movable with respect to the first frame member 52 and the second frame member 54. Specifically, the ends of the first rail 56a and the second rail 56b of the third frame member 56 include a first connector 100 configured to releasably connect to the first frame member 52. Similarly, the opposite ends of the first rail 56a and the second rail 56b of the third frame member 56 include a second connector 102 configured to releasably connect to the second frame member 54.

As shown in FIGS. 4B and 4C, the connector 100 includes a prong 100a that enters a respective opening 104a or 104b formed in the first frame member 52. In the shown embodiment, the openings 104a, 104b are formed in the first frame member 52 as elongated slots, with the prong 100a having a relatively small diameter to enable the prong to be seated at any position along the length of the opening. Similarly, the connector 102 includes a prong 102a that enters a respective opening 106a, 106b formed in the second frame member 54. The openings 106a, 106b are formed in the second frame member as elongated slots, with the prong 102a a relatively small diameter to enable the prong to be seated at any position along the length of the opening.

With reference to FIG. 4C, which illustrates connector 102, it should be understood that connectors 100, 102 are identical in construction so the description of connector 102 applies to connector 100. To secure the connector 102 in place, a spring-loaded detent assembly, generally indicated at 108, is provided. The spring loaded detent assembly 108 includes a detent 108a that is configured to enter into an opening formed in a side of the second frame member 54 to secure the connector 102 to the second frame member. The spring-loaded detent assembly 108 is moved laterally by the tooling member when securing the tooling members to the third frame member 56 to move the third frame member. Specifically, the spring-loaded detent assembly 108 includes a member 108b coupled to the detent 108a to move the detent in an inboard direction with respect to the second frame member 54.

The arrangement is such that the third frame member 56 can be positioned with respect to the first frame member 52 and the second frame member 54 at locations other than the shown midpoint of the first and second frame members. For example, the third frame member 56 can be positioned toward the side 48 of the perimeter frame 42 or toward the side 50 of the perimeter frame. The lengths of the elongated openings 104a, 104b, and the elongated openings 106a, 106b enable the prongs 100, 102 to slide within their respective openings thereby enabling the positioning of the third frame member 56 to be varied with respect to the first frame member 52 and the second frame member 54. When release by the tooling members, the detents of the spring-loaded detent assembly enter their respective openings to secure the third frame member 56 in place with respect to the first frame member 52 and the second frame member 54. The purpose of the functionality of movement of the third frame member 56 with respect to the first and second frame members 52, 54 will be described as the description of the tooling tray 40 proceeds.

Figure 5:
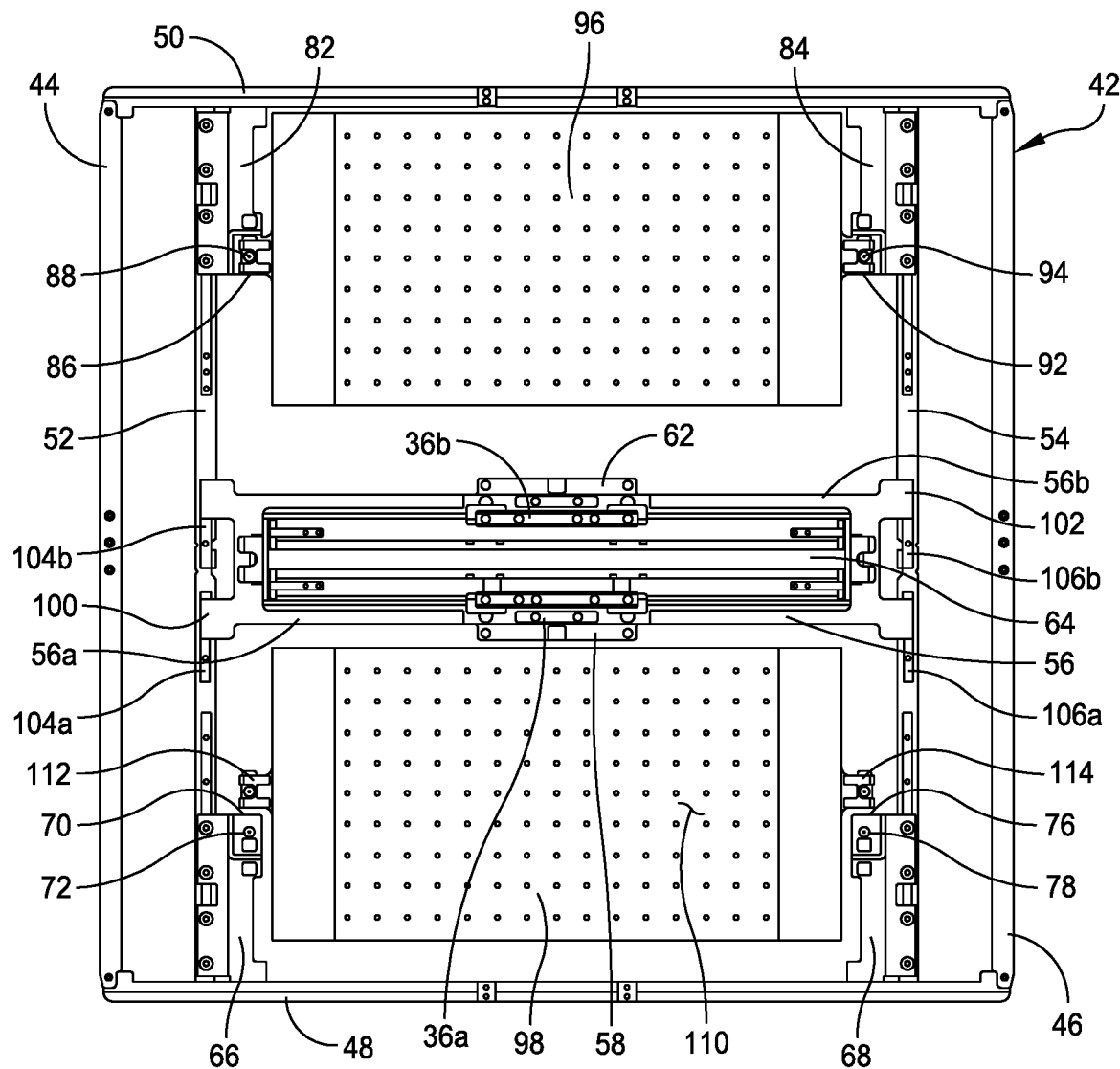
FIG. 5 is a top plan view of the tooling tray supporting clean tooling and used tooling showing a central section being located in a middle or central position.

Referring to FIG. 5, the tooling tray 40 is shown supporting the new tooling 96 and the used squeegee blades (squeegee blades 36a, 36b) shown in FIG. 4. As will be described in greater detail below with reference to FIG. 9, tooling members provided on the print head assembly 20 are used to lift used tooling 98 off of the support assembly 28 of the stencil printer 10. The manner in which the used tooling 98 is secured and raised with respect to the support assembly 28 will be described in greater detail below.

As shown, each tooling, e.g., tooling 98, includes a rectangular tooling plate 110 that is configured to support the electronic substrate during a print operation. The tooling 98 further includes two outwardly extending support tabs 112, 114 provided at opposite edges of the tooling plate. Each support tab 112, 114 includes a respective opening, sometimes referred to herein as a receiving feature, which are sized to receive a respective tooling member therein to releasably secure the tooling member to the support tab.

Figure 6:
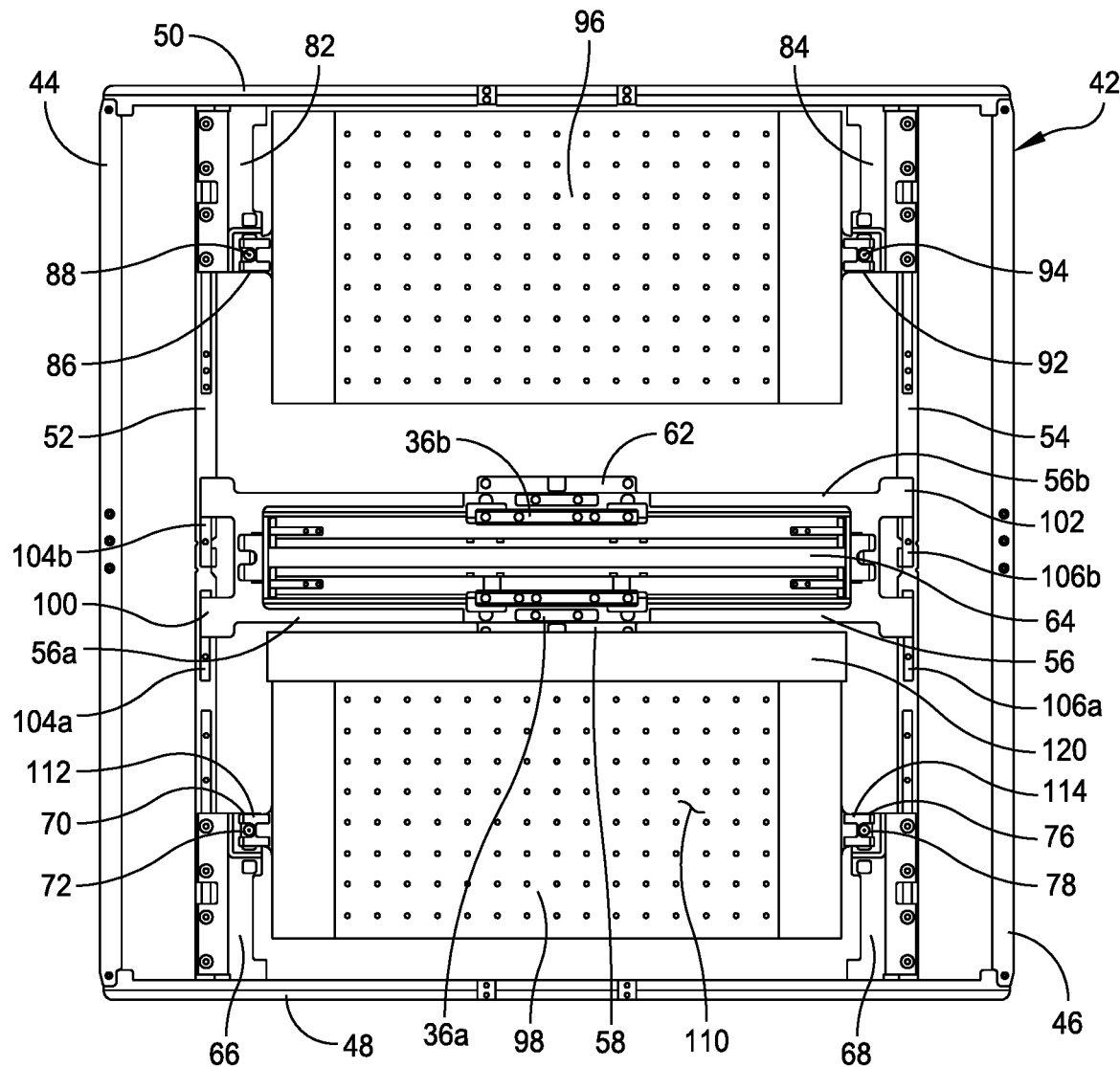
FIG. 6 is a top plan view of the tooling tray showing the used tooling moved away from the central section.

Referring to FIG. 6, the tooling members are configured to engage the support tabs 112, 114 to lift the used tooling 98 off of the support assembly 28 of the stencil printer 10 and place the tooling on the supports 66, 68 of the tooling tray 40. As shown, there is a space 120 between an upper edge of the used tooling 98 and the lower edges of the first rail 56a and the squeegee blade support structure 58 of the third frame member 56.

Figure 7:
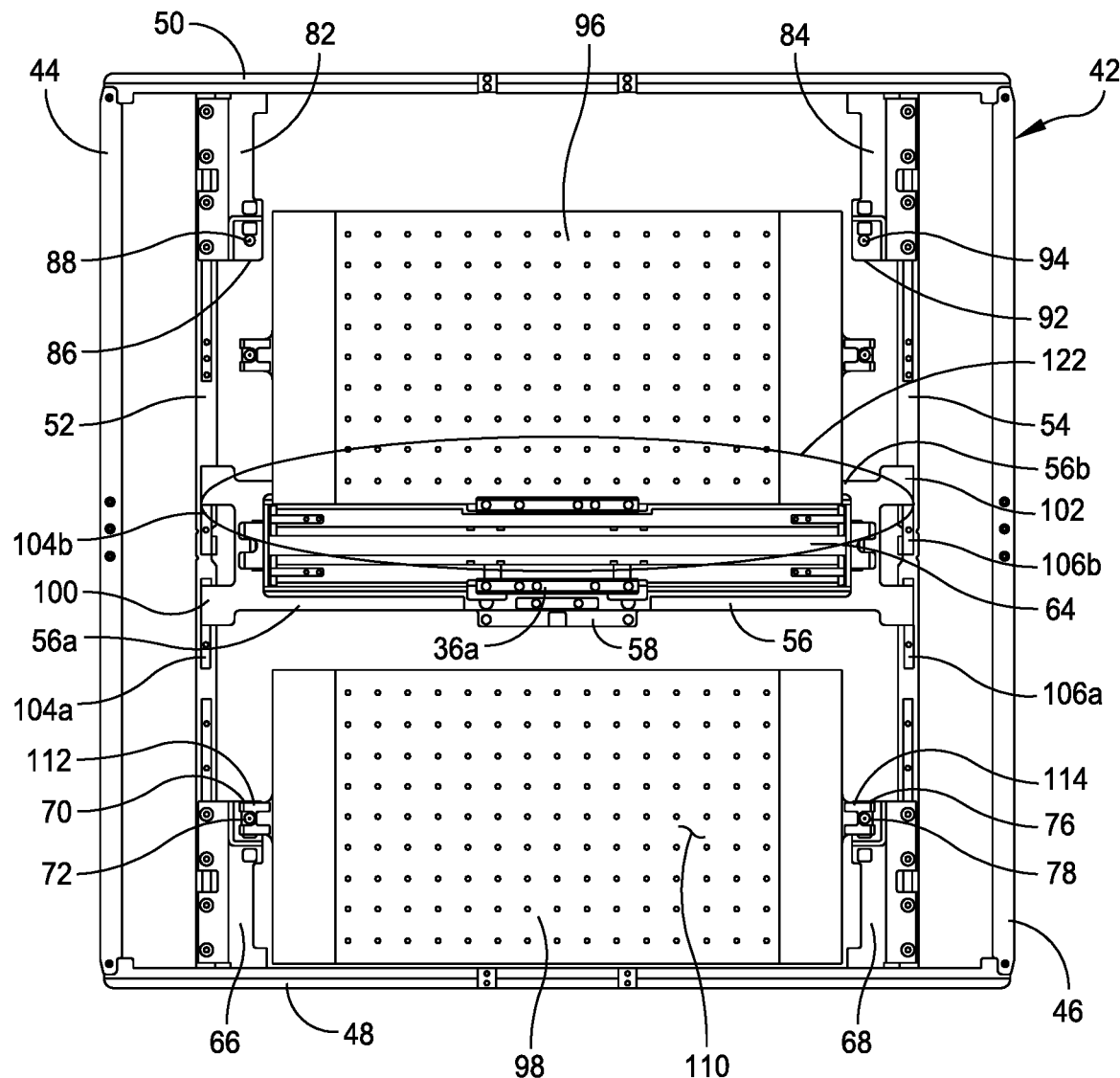
FIG. 7 is a top plan view showing clean tooling in the process of being picked up to be positioned in the stencil printer interfering with the central section.

Referring to FIG. 7, when it is desired to engage and lift the new or clean tooling 96 from the tooling tray 40, the third frame member 56 interferes with the downward movement of the new tooling by the tooling members. This interference is shown by oval 122. As mentioned above, the third frame member 56 is configured to be moved to create additional space to remove the new tooling 96 from the tooling tray 40. Specifically, the third frame member 56 can be moved downwardly toward the side 48 of the perimeter frame 42 of the tooling tray 40 to occupy the space 120 shown in FIG. 6.

Figure 8:
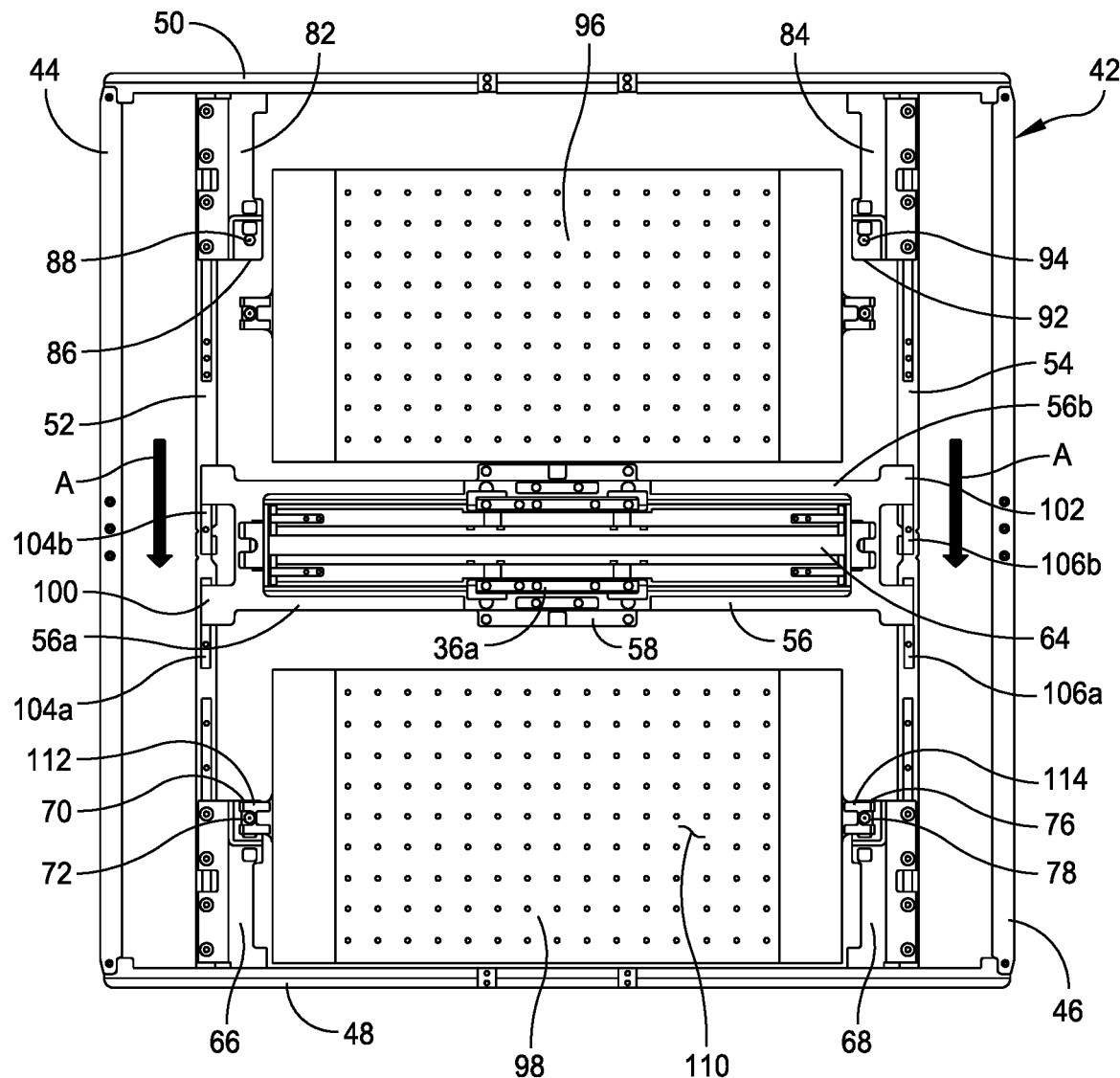
FIG. 8 is a top plan view showing the middle section being moved to create space to pick up the clean tooling.

Referring to FIG. 8, the third frame member 56 is picked up by the tooling members and moved toward the used tooling 98 as noted by arrows A so that the lower edges of the first rail 56a and the squeegee blade support structure 58 of the third frame member are adjacent the upper edge of the used tooling provided on supports 66, 68 of the tooling tray 40. As shown, the third frame member 56 is positioned on the first frame member 52 and the second frame member 54 just below a centerline of the lengths of the first and second frame members. A space created by the movement of the third frame member 56 toward the used tooling 98 enables the tooling members to lift the new tooling 96 off the tooling tray 40 and to deposit the new tooling on the support assembly 28 of the stencil printer 10. Once the tooling members position the new tooling on the support assembly 28, the tooling members can be used to reposition the third frame member 56 at its center location on the first frame member 52 and the second frame member 54.

Figure 9:
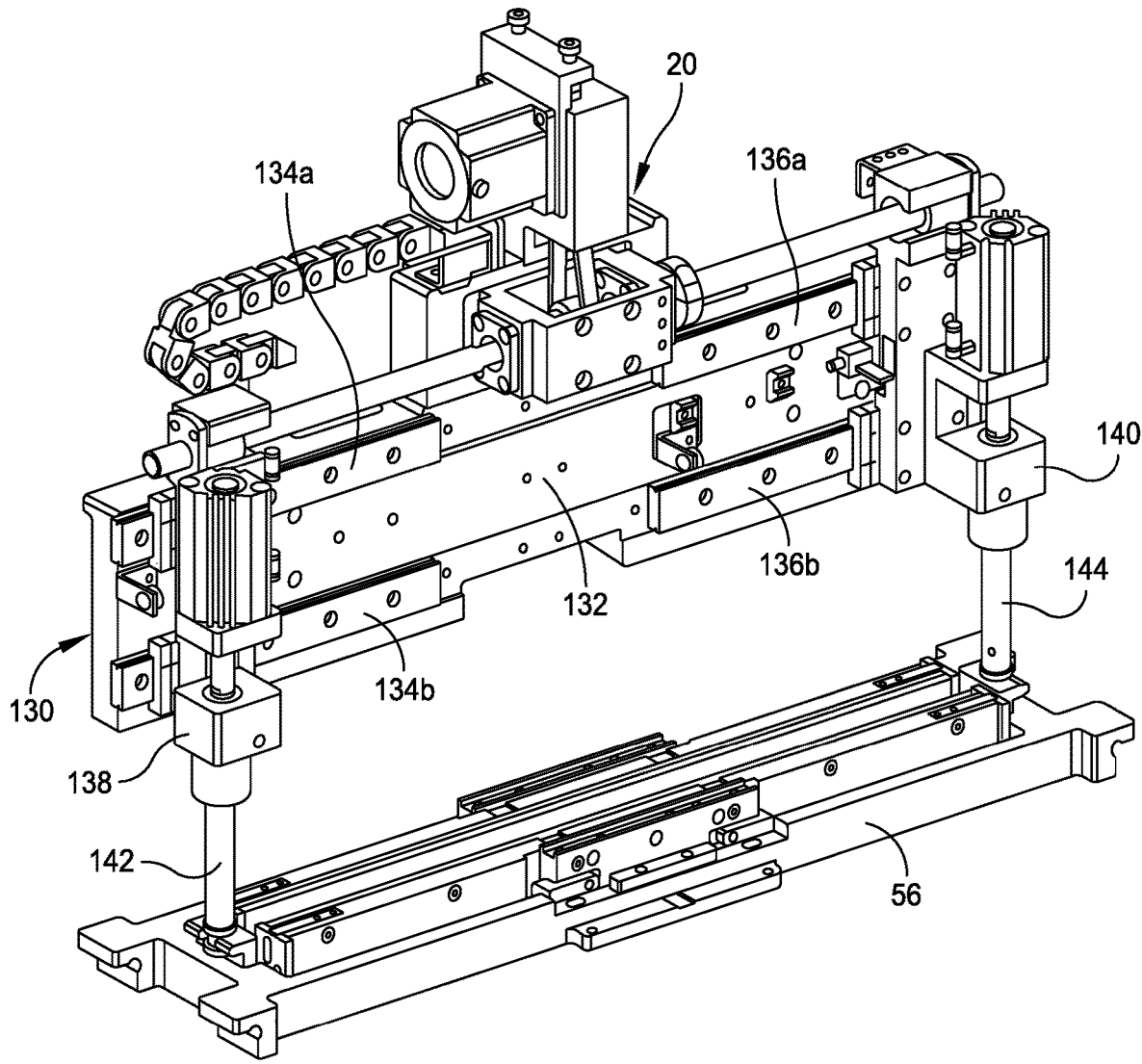
FIG. 9 is a perspective view of a print head having tooling members used to pick up and move items from the tooling tray.

Referring to FIG. 9, a support tooling movement mechanism is generally indicated at 130, which is configured to move the tooling, e.g., tooling 96 or 98, from the tooling tray 40 to the stencil printer 10. The support tooling movement mechanism 130 further is configured to move the third frame member 56 with the respect to the first frame member 52 and the second frame member 54 and to position the third frame member in a desired location, e.g., between the center location and the staggered or off-center location.

As shown, the support tooling movement mechanism 130 includes a plate 132 mounted on the print head assembly 20. The plate 132 has four linear bearings, indicated at 134a, 134b, 136a, 136b, with a first set of linear bearings 134a, 134b being positioned one above the other on one side of the plate and a second set of linear bearings 136a, 136b being positioned one above the other on the other side of the plate. As shown, the movement mechanism 130 further includes a tooling member 138 mounted on the first set of linear bearings 134a, 134b and a second tooling member 140 mounted on the second set of linear bearings 136a, 136b. The tooling members 138, 140 are configured to move laterally with respect to one another on their respective linear bearings. Any suitable drive mechanism can be employed to move the tooling members 138, 140. For example, a ball screw drive assembly can be provided to move the tooling member 138 or 140 along its respective linear bearings. In one embodiment, the mechanism can be powered by the drive assembly that powers the up-and-down movement of the print head assembly 20 in the z-axis direction. Further, each tooling member 138, 140 includes a downwardly extending pin 142, 144, respectively, having a head configured to be received within receiving features associated with the squeegee blades, the tooling and the third frame member 56 of the tooling tray 40.

Specifically, as shown above with reference to FIG. 4C, the third frame member 56 includes the member 108b of the spring-loaded detent assembly 108 that is configured to be engaged by the head of the pin (pin 142 or pin 144) of the tooling member (tooling member 138 or tooling member 140, respectively). The spring-loaded detent assemblies function as receiving features associated with the third frame member 56, each being configured to secure the heads of the pins of the tooling members to enable the tooling members to engage, secure and lift the third frame member 56. Similarly, the support tabs 112, 114 of the tooling is configured to be engaged by the head of the pin of the tooling member.

In one embodiment, when moving the tooling, e.g., tooling 96, the pins 142, 144 of the tooling members 138, 140, respectively, can be extended to a width wider than the spring-loaded detent assemblies 108 of the third frame member 56, and moved toward one another to capture the third frame member between the pins via the spring-loaded detent assemblies. Similarly, when moving the tooling, e.g., tooling 96, the pins 142, 144 of the tooling members 138, 140 can be extended to a width wider than the support tabs 112, 114 of the tooling, and moved toward one another to capture the tooling between the pins via the support tabs. The arrangement is such that the print head assembly 20 can be raised in a z-axis direction to pick up the third frame member 56 or the tooling 96 or 98. The mechanism used to pick up and drop off the third frame member 56 or the tooling 96 or 98 can be configured to engage and secure the third frame member or the tooling can include magnets to facilitate attachment and detachment of the third frame member or tooling from the tooling members.

Various controllers, such as the controller 14, may execute various operations discussed above. Using data stored in associated memory and/or storage, the controller 14 also executes one or more instructions stored on one or more non-transitory computer-readable media, which the controller 14 may include and/or be coupled to, that may result in manipulated data. In some examples, the controller 14 may include one or more processors or other types of controllers.

In one example, the controller 14 is or includes at least one processor. In another example, the controller 14 performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

As used herein, "transport" or "transporting" describes moving an item from one position to another, either manually or with a machine.

As used herein, "install" or "installing" describes the process of placing an item in a position ready for use.

The concepts disclosed herein may be employed in other types of equipment used to fabricate electronic substrates, including dispensers, pick-and-place machines, reflow ovens, wave soldering machines, selective solder machines, and inspection stations. For example, the concepts directed to replacing paste cartridges can be employed in dispensers used to dispense viscous material. In another example, the concepts directed to replacing tooling can be employed in dispensers and in pick-and-place machines used to mount electronic components onto electronic substrates. In another example, the concepts directed to replacing items can be employed in replacing solder within wave soldering and selective soldering machines and cleaning product within cleaning stations.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the disclosure. Accordingly, the foregoing description and drawings are by way of example only.

What is claimed is:

1. A tooling tray for a stencil printer, the tooling tray comprising:
   a perimeter frame having four sides;
   a first frame member spaced from a first side of the perimeter frame;
   a second frame member spaced from a second side of the perimeter frame, the first side and the second side of the perimeter frame being parallel with one another;
   a third frame member extending between and secured to the first frame member and the second frame member, the third frame member being configured to support at least one squeegee blade;
   a first support secured to the first frame member and a second support secured to the second frame member, the first support and the second support together being configured to support a tooling plate; and
   a third support secured to the first frame member and a fourth support secured to the second frame member, the third support and the fourth support together being configured to support a tooling plate,
   wherein the third frame member is configured be to be moved from a first position from the first frame member and the second frame member and installed in a second position on the first frame member and the second frame member, the second position being spaced from the first position.

2. The tooling tray of claim 1, wherein the first position of the third frame member is located along midpoints of the first frame member and the second frame member.

3. The tooling tray of claim 2, wherein the second position of the third frame member is spaced from the first position toward one of a third side and a fourth side of the perimeter frame.

4. The tooling tray of claim 1, wherein the third frame member includes opposite ends, each end having a connector configured to mate its respective first frame member and second frame member.

5. The tooling tray of claim 4, wherein each connector includes at least one downwardly extending prong configured to be received in an opening of its respective first frame member or second frame member to position the third frame member with respect to the first frame member and the second frame member.

6. The tooling tray of claim 1, wherein each connector includes a spring-loaded detent assembly configured to releasably secure the connector to its respective first frame member or second frame member.

7. The tooling tray of claim 1, wherein the third frame member includes at least one squeegee blade support structure.

8. The tooling tray of claim 7, wherein the third frame member further includes a drip tray secured to a bottom surface of the third frame member.

9. The tooling tray of claim 1, wherein the first support and the second support are positioned adjacent a third side of the perimeter frame and the third support and the fourth support are positioned adjacent a fourth side of the perimeter frame.

10. The tooling tray of claim 9, wherein the first support and the second support are spaced apart from one another a predetermined distance sufficient to support the tooling plate.

11. The tooling tray of claim 10, wherein the third support and the fourth support are spaced apart from one another a predetermined distance sufficient to support the tooling plate.

12. The tooling tray of claim 1, wherein the first support, the second support, the third support, and the fourth support each include a feature configured to engage a mating feature associated with the tooling plate to support the tooling plate.

13. The tooling tray of claim 12, wherein the feature is a pin and the mating feature is an opening sized to receive the pin.

14. A method for replacing items in a stencil printer, the method comprising:
providing a tooling tray including a perimeter frame having four sides, a first frame member spaced from a first side of the perimeter frame, a second frame member spaced from a second side of the perimeter frame, the first side and the second side of the perimeter frame being parallel with one another, and a third frame member extending between and secured to the first frame member and the second frame member, the third frame member being configured to support at least one squeegee blade, the third frame member being configured to move from a first position in which the third frame member is located at midpoints of the first frame member and the second frame member to a second position spaced from the first position, the second position being spaced from the first position, the tooling tray further including a first tooling support, a second tooling support and a squeegee blade support;
providing a new tooling plate on the first tooling support of the tooling tray;
removing a used tooling plate from a support assembly of a stencil printer;
positioning the used tooling plate on the second tooling support of the tooling tray;
moving the third frame member from the first position to the second position;
removing the new tooling plate from the tooling tray; and
installing the new tooling plate on the support assembly of the stencil printer.

15. The method of claim 14, further comprising moving the third frame member from the second position to the first position once the new tooling plate is installed on the support assembly of the stencil printer.

16. The method of claim 14, wherein the third frame member includes opposite ends, each end having a connector configured to mate its respective first frame member and second frame member.

17. The method of claim 16, wherein each connector includes at least one downwardly extending prong configured to be received in an opening of its respective first frame member or second frame member, and wherein the method further comprises positioning the third frame member with respect to the first frame member and the second frame member.

18. The method of claim 16, wherein each connector includes a spring-loaded detent assembly configured to releasably secure the connector to its respective first frame member or second frame member, and wherein the method further comprises releasably securing the third frame member to the first frame member and the second frame member.

19. The method of claim 16, wherein the movements of the third frame member between the first position and the second position is achieved by tooling members of a print head assembly of a stencil printer, the tooling members each including a pin having a head configured to releasably engage the connectors of the third frame member.

* * * * *